United States Patent [19]

Isham et al.

[11] 4,260,960
[45] Apr. 7, 1981

[54] OSCILLATOR CIRCUIT

[75] Inventors: Robert H. Isham, Wilkes Barre, Pa.;
Cesare J. Petrizio, Flanders, N.J.

[73] Assignee: RCA Corporation, New York, N.Y.

[21] Appl. No.: 38,211

[22] Filed: May 11, 1979

[51] Int. Cl.³ .............................................. H03K 3/35
[52] U.S. Cl. .................................... 331/111; 331/143
[58] Field of Search ................... 331/111, 107 R, 143;
307/247, 252, 274; 315/209 SC

[56] References Cited

U.S. PATENT DOCUMENTS

| 3,184,665 | 5/1965 | Wright | 331/111 |
| 3,197,716 | 7/1965 | Wright et al. | 331/111 |
| 3,206,696 | 9/1965 | Wright | 331/107 |
| 3,299,297 | 1/1967 | Motto, Jr. | 307/252 |
| 3,308,800 | 3/1967 | Motto, Jr. et al. | 123/148 |
| 3,343,104 | 9/1967 | Motto, Jr. | 331/111 |
| 3,728,713 | 4/1973 | Alten | 331/111 |
| 3,882,421 | 5/1975 | Stein | 331/111 |
| 4,103,258 | 7/1978 | Iida et al. | 331/111 |

*Primary Examiner*—David K. Moore
*Attorney, Agent, or Firm*—E. M. Whitacre; P. J. Rasmussen; J. M. O'Meara

[57] ABSTRACT

Within an oscillator circuit of the type wherein positive or negative current is recurrently directed to the gate of a GTO device when the charge voltage levels across first and second capacitors respectively reach trigger levels, voltage sensing circuitry is incorporated to insure that the capacitors are charged during independent periods of time so that the duration of each portion in the frequency cycles is separately controllable.

6 Claims, 1 Drawing Figure

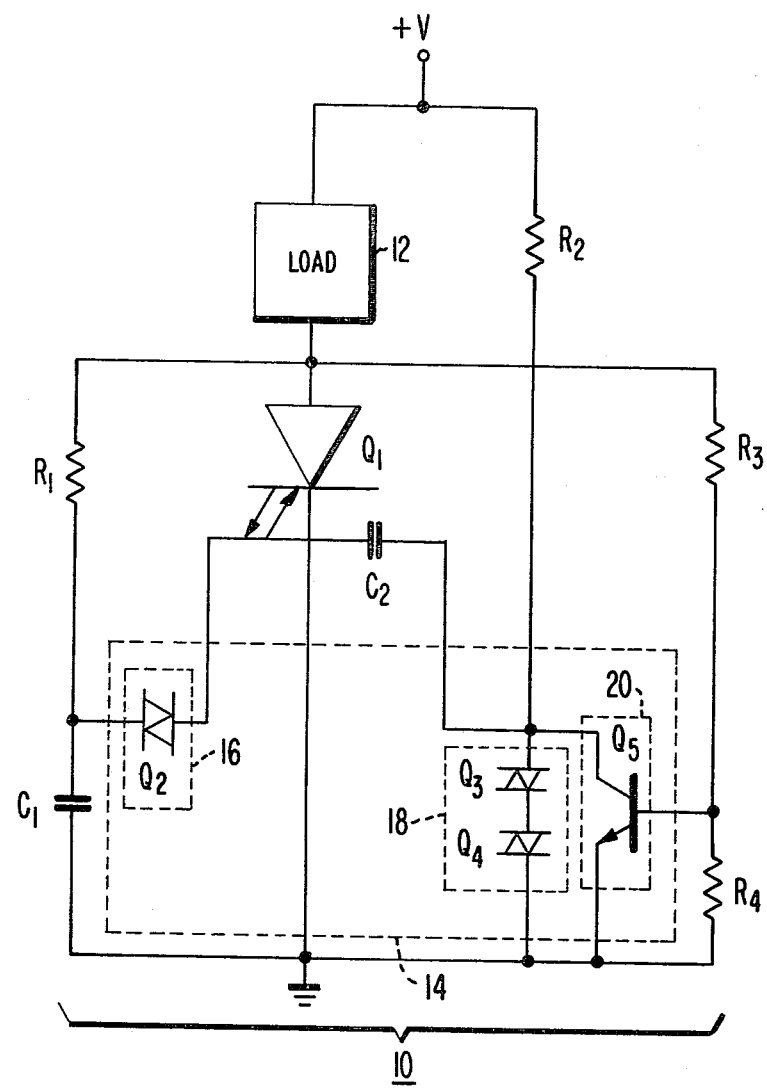

OSCILLATOR CIRCUIT

The present invention relates to an oscillator circuit of the type wherein positive current is directed to the gate of a gate turn-off (GTO) device to initiate one portion of each frequency cycle when a first capacitor is charged to a first trigger level and wherein a negative current is directed to that gate to initiate the other portion of each frequency cycle when a second capacitor is charged to a second trigger level. GTO devices typically include four alternate layers of P and N type semiconductor material with the outer layers being anode and cathode regions respectively, while the inner layer closer to the cathode region is a gate region to which current of opposite polarities is applied in controlling conduction between the anode and cathode regions. Such devices are commonly known as switchable rectifiers, transwitches, and gate controlled switches.

Although oscillator circuits of this type are well known in the art, the ON and OFF durations of the GTO device during each oscillation cycle are not easily proportioned because the capacitors are not charged independently of each other. Consequently, where the half wave portions of each oscillation cycle requires those ON and OFF durations to be precise, the circuit parameters of such oscillators are difficult to fix. Furthermore, the ON duration of the GTO device cannot be shorter than its OFF duration in such prior art oscillators.

These problems are overcome in the oscillator circuit of the invention by charging the first and second capacitors over independent time periods with positive current being applied to the gate of the GTO device when the first capacitor has been charged to the first trigger level and negative current being applied thereto when the second capacitor has been charged to the second trigger level. In one preferred embodiment, the first and second trigger levels are determined with diacs, while a bipolar transistor is disposed with its collector-emitter path connected to selectively ground the charge level across the second capacitor and with its base connected to respond to the voltage level across the GTO device.

In the drawing:

The sole FIGURE is a block diagram of the invention and a schematic diagram of the preferred embodiments is also illustrated therein.

In the sole FIGURE, an oscillator circuit 10 is shown of the type wherein positive current is directed to the gate of a GTO device $Q_1$ when a first capacitor $C_1$ is charged to a first trigger level and wherein negative current is directed to that gate when a second capacitor $C_2$ is charged to a second trigger level. As is commonly known in the electronic arts, $Q_1$ is a four layer, semiconductor structure having a gate at which positive or negative current is applied to selectively control the conductivity of a main conduction path between an anode and a cathode. A positive gate current pulse renders the main conduction path of $Q_1$ conductive, while a negative gate current pulse renders that main conduction path non-conductive. As compared with other semi-conductive switching devices such as transistors, GTO devices have very rapid turn-on and turn-off times, and their gate pulse control is advantageous for many applications where a transistor would otherwise draw continuous base current.

The main conduction path of $Q_1$ is series connected with a load 12 between a D.C. supply voltage $+V$ and a reference voltage such as ground. One plate of $C_1$ is connected through a resistor $R_1$ to the interconnection between $Q_1$ and the load 12, while the other plate of $C_1$ is connected to ground. One plate of $C_2$ is connected to $+V$ through a resistor $R_2$, while the other plate of $C_2$ is connected to the gate of $Q_1$. A voltage sensing means 14 is arranged in the oscillator 10 for applying either a positive or negative current to the gate of $Q_1$ when the first or second trigger levels respectively, are reached across $C_1$ or $C_2$ during independent periods of time.

$Q_1$ is alternately rendered conductive and non-conductive during the operation of the oscillator 10. When $Q_1$ is non-conductive, $C_1$ is charged toward $+V$ through $R_1$ and the load 12 until the first trigger level is reached thereacross. The voltage sensing means 14 then detects the first trigger level and responds to apply a positive current pulse at the gate of $Q_1$. The main conduction path through $Q_1$ then becomes conductive to drop the voltage level between $Q_1$ and the load 12 substantially to ground so that $C_1$ is discharged toward ground through $R_1$. While $Q_1$ is conductive, $C_2$ is charged toward $+V$ through $R_2$ until the second trigger level is reached thereacross. The voltage sensing means 14 then detects the second trigger level and responds to apply a negative current pulse at the gate of $Q_1$. The main conduction path through $Q_1$ then becomes non-conductive, allowing the voltage level between $Q_1$ and the load 12 to rise, which initiates a repeat of the previously discussed operation for another frequency cycle of the oscillator 10. Therefore, $C_1$ and $C_2$ are charged during independent periods of time in each frequency cycle and the voltage drop experienced across the load 12 as the output of the oscillator 10 is very small when $C_1$ is being charged, but large when $C_2$ is being charged. The charging duration of either $C_1$ or $C_2$, or both, can be conventionally adjusted by changing the resistance value or the capacitance value, or both, in either the $R_1C_1$ or $R_2C_2$, or both, time constants. Therefore, the duration of each portion of the frequency cycle is independently adjustable such as by utilizing variable resistors for $R_1$ and $R_2$ or variable capacitors for $C_1$ and $C_2$. Consequently, the duty cycle of the voltage drop magnitude across the load 12 can also be precisely proportioned by merely adjusting the charging duration of either $C_1$ or $C_2$, or both of them.

Although many embodiments of the invention are possible in regard to the voltage sensing means 14, a schematic diagram for one preferred embodiment thereof is shown in FIG. 1. A first threshold means 16 is included in the voltage sensing means 14 for conducting positive current to the gate of $Q_1$ when $C_1$ has been charged to the first trigger level and a second threshold means 18 is included therein for conducting negative current to the gate of $Q_1$ when $C_2$ has been charged to the second trigger level. A switch means 20 is also included in the voltage sensing means for selectively shunting the charge level on $C_2$ to ground in response to the voltage level across $Q_1$ being increased toward $+V$.

The first threshold means 16 functions to detect when $C_1$ has been charged to the first trigger level and applies a positive current at the gate of $Q_1$ to terminate one portion of each frequency cycle during which a very small voltage drop is experienced across the load 12. The voltage level between $Q_1$ and the load 12 is substantially equal to $+V$ during this portion of the frequency cycles and the switch means 20 responds to that level by shunting across the second threshold means 18 to clamp $C_2$ at substantially ground level. Then after $Q_1$ has become conductive, the second threshold means 18 functions to detect when $C_2$ has been charged to the second trigger level and applies a negative current at the gate of $Q_1$ to terminate the remaining portion of each frequency cycle during which a large voltage drop is experienced across the load 12. The voltage level across $Q_1$ is substantially ground during this portion of the frequency cycles and the switch means 20 responds to that level by opening the shunt across the second threshold means 18 to unclamp $C_2$.

Both the first and second threshold means 16 and 18 could have many circuit embodiments. In one embodiment of the sole FIGURE, at least one diac $Q_2$ is connected from between $R_1$ and $C_1$ to the gate of $Q_1$ as the first threshold means 16, while at least one diac $Q_3$ is connected between $C_2$ and ground as the second threshold means 18. As is commonly known in the electronic arts, a diac is a two-electrode, three-layer bidirectional avalanche diode which is rendered conductive in either direction when a breakover voltage of positive or negative polarity is applied across it and thereafter, it exhibits a negative resistance characteristic in that current through it increases with decreasing voltage across it. Within the first and second threshold means 16 and 18 respectively, $Q_2$ and $Q_3$ are selected to have voltage breakover characteristics equal to the first and second trigger levels respectively. Therefore, $Q_2$ becomes conductive to apply positive current at the gate of $Q_1$ when the first trigger level is reached across $C_1$ and $Q_3$ becomes conductive to apply negative current at the gate of $Q_1$ when the second trigger level is reached across $C_2$. Once $Q_2$ or $Q_3$ become conductive, their negative-resistance characteristics assure that sufficient current will be applied to the gate of $Q_1$ even if the charge levels across $C_1$ or $C_2$ respectively should be reduced below the first or second trigger levels. Furthermore, the first or second trigger levels may be adjusted by series connecting diacs in the first or second threshold means 16 or 18 respectively, as is shown by the addition of a diac $Q_4$ is another embodiment of the sole FIGURE. Alternatively, other voltage detecting elements such as diodes or zener diodes could also be used in the first or second threshold means 16 or 18 to establish the first and second trigger levels, so long as a negative resistance conduction characteristic, similar to that available through $Q_2$ or $Q_3$ in the previously described embodiment, exists after each trigger level is reached. The switch means 20 could also have many embodiments and one such embodiment is shown in the sole FIGURE where a bipolar transistor $Q_5$ is disposed with its collector-emitter path connected across the second threshold means 18 and with a voltage applied to its base in proportion to the voltage between $Q_1$ and the load 12. The collector-emitter path of $Q_5$ becomes conductive to establish a shunt path across the second threshold means 18 when the voltage between $Q_1$ and the load 12 is substantially equal to $+V$ and non-conductive to interrupt this shunt path when that voltage is substantially at ground level. The proportionality between the voltages at the base of $Q_5$ and at the interconnection of $Q_1$ and the load 12 may be derived in many ways such as with the resistors $R_3$ and $R_4$ which are series connected as a voltage divider in the sole FIGURE.

Consequently, this invention has been disclosed herein by describing only a few embodiments thereof and numerous changes in the details of construction and the combination or arrangement of parts could be made in these described embodiments without departing from the true scope and spirit of the invention. Therefore, the described embodiments of the present invention should be construed as illustrative rather than limiting.

What we claim is:

1. An oscillator circuit of the type including a GTO device having a gate and having a main conduction path wherein current of a first polarity is directed to the gate of said GTO device for initiating conduction therein when a first capacitor is charged to a first trigger level, while current of a second polarity is directed thereto when a second capacitor is charged to a second trigger level for terminating conduction therein; and wherein an output frequency is generated across a load which is series connected with the main conduction path of said GTO device between a D.C. supply voltage terminal and a reference voltage terminal, the improvement comprising:

voltage sensing means for applying the first polarity current to the gate of said GTO device when said first trigger level is reached and the second polarity current thereto when said second trigger level is reached with the main conduction path of said GTO device being rendered conductive by the first polarity gate current and nonconductive by the second polarity gate current to charge said first and second capacitors during independent periods of time, including first threshold means connected serially with said first capacitor between the gate of said GTO device and said reference voltage terminal for supplying said current of said first polarity to the gate of said GTO device when said first trigger level is reached across said first capacitor;

second threshold means connected serially with said second capacitor between the gate of said GTO device and an end of its main conduction path for supplying said current of said second polarity to the gate of said GTO device when said second trigger level is reached across said second capacitor; and switch means for selectively shunting said second capacitor in response to the voltage level across the main conduction path of said GTO device exceeding a predetermined level.

2. The oscillator circuit of claim 1 wherein said first threshold means includes at least one diac.

3. The oscillator circuit of claim 1 wherein said second threshold means includes at least one diac.

4. The oscillator circuit of claim 1 wherein said switch means includes a bipolar transistor having a voltage responsive to the voltage level across said GTO device applied between its base and emitter for conditioning said bipolar transistor to conduct the charge level on said second capacitor to said reference voltage terminal through its collector-emitter path.

5. In a circuit including a GTO device in serial connection with load means between a D.C. supply voltage terminal and a reference voltage terminal, wherein said GTO device responds to current of a first polarity at its gate to discontinue conduction through its main conduction path, means for supplying said current of first polarity comprising:

means for determining a period of time including a capacitor connected between the gate of said GTO device and a first node, and resistance means connected between said D.C. supply voltage terminal and said first node;

voltage threshold means connected between said first node and said reference voltage terminal; and a bipolar transistor having its collector-emitter path connected across said voltage threshold means, and having its base electrode connected to receive a control signal in response to which the charge level of said capacitor is conducted through said collector-emitter path to said reference voltage terminal.

6. Means for supplying said current of first polarity as set forth in claim 5 wherein said control signal is responsive to the voltage across the main-conduction path of said GTO device.

* * * * *

UNITED STATES PATENT AND TRADEMARK OFFICE
CERTIFICATE OF CORRECTION

PATENT NO. : 4,260,960
DATED : April 7, 1981
INVENTOR(S) : Robert H. Isham et al.

It is certified that error appears in the above—identified patent and that said Letters Patent is hereby corrected as shown below:

IN THE CLAIMS:

Column 4, Line 48 (Claim 3) - change "1" to -- 1 or 2 -- .

Signed and Sealed this

Twenty-seventh Day of October 1981

[SEAL]

Attest:

GERALD J. MOSSINGHOFF

Attesting Officer     Commissioner of Patents and Trademarks